(12) United States Patent
Loubet (10) Patent No.: US 11,575,024 B2
(45) Date of Patent: Feb. 7, 2023

(54) FORMING GATE LAST VERTICAL FET WITH SELF-ALIGNED SPACERS AND JUNCTIONS

(71) Applicant: International Business Machines Corporation, Armonk, NY (US)

(72) Inventor: Nicolas Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/324,894

(22) Filed: May 19, 2021

(65) Prior Publication Data

US 2021/0328045 A1   Oct. 21, 2021

Related U.S. Application Data (62) Division of application No. 16/294,710, filed on Mar. 6, 2019, now Pat. No. 11,038,042.

(51) Int. Cl.
*H01L 29/66* (2006.01)
*H01L 29/78* (2006.01)
(Continued)

(52) U.S. Cl.
CPC .... *H01L 29/66666* (2013.01); *H01L 21/2257* (2013.01); *H01L 21/3086* (2013.01);
(Continued)

(58) Field of Classification Search
CPC .......... H01L 29/66666; H01L 21/2257; H01L 21/3086; H01L 29/7827; H01L 29/66545; H01L 29/16; H01L 29/161
See application file for complete search history.

(56) References Cited

U.S. PATENT DOCUMENTS 9,525,064 B1 * 12/2016 Balakrishnan .... H01L 29/66666
9,530,866 B1 * 12/2016 Zhang ................. B82Y 10/00
(Continued)

OTHER PUBLICATIONS

Loup et al., "Silicon and SiGe alloys wet etching using TMAH chemistry," Abstract #2101, 224th ECS Meeting, Oct./Nov. 2013, 1 page.

(Continued)

*Primary Examiner* — Shahed Ahmed
*Assistant Examiner* — Khatib A Rahman
(74) *Attorney, Agent, or Firm* — Samuel Waldbaum; Michael J. Chang, LLC (57) ABSTRACT

Techniques for forming gate last VFET devices are provided. In one aspect, a method of forming a VFET device includes: forming a stack on a wafer including: i) a doped bottom source/drain, ii) sacrificial layers having layers of a first sacrificial material with a layer of a second sacrificial material therebetween, and iii) a doped top source/drain; patterning trenches in the stack to form individual gate regions; filling the trenches with a channel material to form vertical fin channels; selectively removing the layers of the first sacrificial material forming first cavities in the gate regions; forming gate spacers in the first cavities; selectively removing the layer of the second sacrificial material forming second cavities in the gate regions; and forming replacement metal gates in the second cavities. A VFET device is also provided.

19 Claims, 10 Drawing Sheets

A-A'

(51) Int. Cl.
*H01L 21/225* (2006.01)
*H01L 29/16* (2006.01)
*H01L 21/308* (2006.01)

(52) U.S. Cl.
CPC ........ *H01L 29/16* (2013.01); *H01L 29/66545* (2013.01); *H01L 29/7827* (2013.01)

(56) References Cited

U.S. PATENT DOCUMENTS

| | | |
|---|---|---|
| 9,595,613 B1 * | 3/2017 | Cheng ................ H01L 29/7848 |
| 9,640,636 B1 | 5/2017 | Bentley et al. |
| 9,660,028 B1 | 5/2017 | Cheng et al. |
| 9,741,716 B1 * | 8/2017 | Cheng ............ H01L 21/823456 |
| 9,754,933 B2 * | 9/2017 | Balakrishnan .... H01L 29/66545 |
| 9,806,173 B2 | 10/2017 | Balakrishnan et al. |
| 9,899,515 B1 * | 2/2018 | Cheng ................ H01L 29/0847 |
| 9,966,454 B2 | 5/2018 | Basker et al. |
| 10,217,846 B1 * | 2/2019 | Xie ...................... H01L 29/165 |
| 10,510,889 B2 * | 12/2019 | More ................ H01L 29/66795 |
| 2011/0012085 A1 * | 1/2011 | Deligianni ........ H01L 29/78642 257/E21.409 |
| 2011/0108803 A1 * | 5/2011 | Deligianni ........ H01L 29/78642 977/762 |
| 2011/0309446 A1 * | 12/2011 | Doris ................ H01L 29/7848 257/E21.415 |
| 2017/0025509 A1 * | 1/2017 | Cheng ................ H01L 21/2253 |
| 2017/0162694 A1 * | 6/2017 | Basker ................ H01L 29/205 |
| 2017/0373162 A1 * | 12/2017 | Cheng .............. H01L 29/66795 |
| 2018/0240873 A1 * | 8/2018 | Cheng ................ H01L 29/6656 |
| 2020/0287023 A1 | 9/2020 | Loubet |

OTHER PUBLICATIONS

Fang et al., "SAQP Pitch walk metrology using single target metrology," Proc. of SPIE, vol. 10145 (Mar. 2017) (7 total pages).

List of IBM Patents or Applications Treated as Related, May 19, 2021 (2 pages).

* cited by examiner

FORMING GATE LAST VERTICAL FET WITH SELF-ALIGNED SPACERS AND JUNCTIONS

FIELD OF THE INVENTION

The present invention relates to vertical field effect transistor (VFET) devices, and more particularly, to techniques for forming gate last VFET devices with self-aligned spacers and junctions.

BACKGROUND OF THE INVENTION

As opposed to planar complementary metal-oxide-semiconductor (CMOS) devices, vertical field effect transistor (VFET) devices are oriented with a vertical fin channel disposed on a bottom source/drain and a top source/drain disposed on the fin channel. VFETs have been pursued as a potential device option for scaling CMOS to the 5 nanometer (nm) node and beyond.

A replacement metal gate (RMG) process for FET fabrication involves forming a sacrificial or 'dummy' gate over the channel which allows placement of the source and drains, after which the dummy gate is removed and replaced with a metal gate. The RMG process flow is advantageous as it prevents exposure of the metal gate materials to potentially damaging conditions such as the elevated temperatures employed during source and drain formation, since the replacement metal gate is not formed until the end of the process. The high-κ dielectrics employed with metal gate stacks are particularly susceptible to high temperature damage. However, due to the vertical orientation of VFET devices, employing a RMG process flow for VFET device fabrication is challenging.

Accordingly, techniques for forming a VFET with RMG would be desirable.

SUMMARY OF THE INVENTION

The present invention provides techniques for forming gate last vertical field effect transistor (VFET) devices with self-aligned spacers and junctions. In one aspect of the invention, a method of forming a VFET device is provided. The method includes: forming a stack on a wafer, the stack including: i) a doped bottom source and drain disposed on the wafer, ii) sacrificial layers disposed on the bottom source and drain, having layers of a first sacrificial material with a layer of a second sacrificial material therebetween, and iii) a doped top source and drain disposed on the sacrificial layers; patterning trenches in the stack to form individual gate regions; filling the trenches with a channel material between the gate regions to form vertical fin channels; selectively removing the layers of the first sacrificial material from the stack forming first cavities in the gate regions; forming gate spacers in the first cavities; selectively removing the layer of the second sacrificial material from the stack forming second cavities in the gate regions; annealing the stack to diffuse dopants from the doped bottom source and drain and the doped top source and drain into the channel material between adjacent gate regions, forming bottom source and drain extensions and top source and drain extensions; and forming replacement metal gates in the second cavities.

In another aspect of the invention, another method of forming a VFET device is provided. The method includes: forming a stack on a wafer, the stack including: i) a doped bottom source and drain disposed on the wafer, ii) sacrificial layers disposed on the bottom source and drain, having layers of a first sacrificial material with a layer of a second sacrificial material therebetween, and iii) a doped top source and drain disposed on the sacrificial layers, wherein the first sacrificial material includes silicon germanium (SiGe) having a germanium (Ge) content of from about 60% Ge to about 100% Ge and ranges therebetween, and wherein the second sacrificial material includes SiGe having a Ge content of from about 30% Ge to about 60% Ge and ranges therebetween; patterning trenches in the stack to form individual gate regions; filling the trenches with a channel material between the gate regions to form vertical fin channels, wherein the channel material includes epitaxial silicon (Si); selectively removing the layers of the first sacrificial material from the stack forming first cavities in the gate regions; forming gate spacers in the first cavities; selectively removing the layer of the second sacrificial material from the stack forming second cavities in the gate regions; annealing the stack to diffuse dopants from the doped bottom source and drain and the doped top source and drain into the channel material between adjacent gate regions, forming bottom source and drain extensions and top source and drain extensions; and forming replacement metal gates in the second cavities.

In yet another aspect of the invention, a VFET device is provided. The VFET device includes: a wafer; gate regions on the wafer, the gate regions each including: i) a doped bottom source and drain disposed on the wafer, ii) a replacement metal gate above the doped bottom source and drain, iii) a doped top source and drain above the replacement metal gate, and iv) gate spacers offsetting the replacement metal gate from the doped bottom source and drain, and from the top doped source and drain; vertical fin channels between the gate regions; and bottom source and drain extensions and top source and drain extensions between adjacent gate regions.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques to form replacement metal gate (RMG) vertical field effect transistor (VFET) devices with self-aligned spacers, junctions, and gate stack. As will be described in detail below, a sacrificial material is used that can be selectively etched versus the channel and gate regions to form the self-aligned spacers. Another sacrificial material is used that can be selectively etched versus the channel to form the self-aligned replacement metal gates. By 'sacrificial' it is meant that these materials, which act as a placeholder, are removed later in the process. A unique structure is achieved in the completed device, where the replacement metal gates are embedded in rectangular cavities surrounded at the top and bottom by gate spacers.

Figure 1:
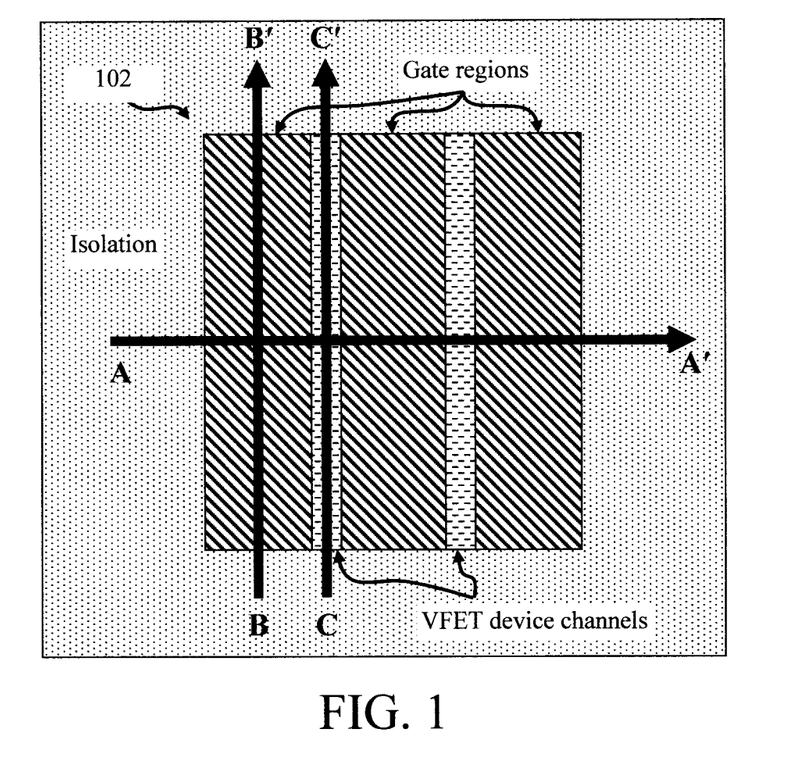
FIG. 1 is a top-down diagram illustrating the present vertical field effect transistor (VFET) device structure according to an embodiment of the present invention.

An exemplary embodiment for forming a RMG VFET device in accordance with the present techniques is now described. In the following description, reference will be made to various different cross-sectional cuts through the device structure. See, for example, FIG. 1 which provides a top-down view of the present device structure. As shown in FIG. 1, an isolated active region 102 of the device includes one or more VFET device channels formed in between a plurality of gate regions. Views A-A' will be used to depict cross-sectional cuts through/perpendicular to the VFET device channels/gate regions. Views B-B' will be used to depict cross-sectional cuts through one of the gate regions parallel to the VFET device channels/gate regions. Views C-C' will be used to depict cross-sectional cuts through one of the VFET device channels parallel to the VFET device channels/gate regions.

Figure 2:
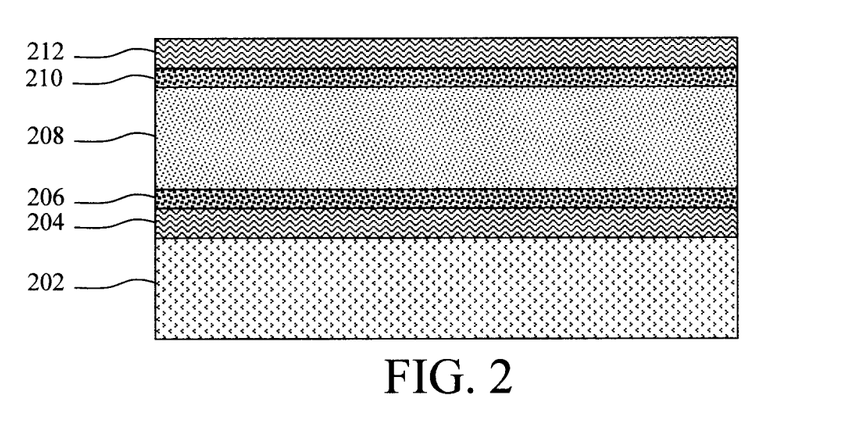
FIG. 2 is a cross-sectional diagram illustrating a doped bottom source and drain having been formed on a wafer, a layer of a first sacrificial material having been formed on the bottom source and drain, a layer of a second sacrificial material having been formed on the layer of the first sacrificial material, another layer of the first sacrificial material having been formed on the layer of the second sacrificial material, and a (doped) top source and drain having been formed on the other layer of the first sacrificial material as a stack on the wafer according to an embodiment of the present invention.

Referring to FIG. 2, the process begins with a wafer 202 on which a stack of layers is deposited/grown. It is notable that the cross-sectional depiction in FIG. 2, would appear identical in each of the views A-A', B-B', and C-C'.

Suitable configurations for wafer 202 include, but are not limited to, a bulk semiconductor wafer (e.g., a bulk silicon (Si) wafer, a bulk germanium (Ge) wafer, a bulk silicon germanium (SiGe) wafer, a bulk III-V wafer, etc.) and a semiconductor-on-insulator (SOI) wafer. SOI wafers include a SOI layer separated from an underlying substrate by a buried insulator. When the buried insulator is an oxide, it is also referred to as a buried oxide or BOX. Suitable materials for the SOI layer include, but are not limited to, Si, Ge, SiGe, III-V, etc. Wafer 202 shown in FIG. 2 generically represents any of these wafer configurations. According to an exemplary embodiment, wafer 102 is doped. Suitable n-type dopants include, but are not limited to, phosphorous (P), arsenic (As) and/or antimony (Sb). Suitable p-type dopants include, but are not limited to, boron (B), gallium (Ga), indium (In), and thallium (Tl).

Fabrication of the stack of layers begins with the formation of a (doped) bottom source and drain 204 on the wafer 202. According to one exemplary embodiment, the bottom source and drain 204 is formed having a thickness of from about 10 nanometers (nm) to about 50 nm and ranges therebetween.

In one exemplary embodiment, bottom source and drain 204 is formed from an in-situ doped (i.e., during growth) epitaxial material such as in-situ doped epitaxial Si, carbon doped silicon (Si:C) and/or SiGe. As provided above, suitable n-type dopants include, but are not limited to, P, As and/or Sb. Suitable p-type dopants include, but are not limited to, B, Ga, In, and Tl. Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. Alternatively, an ex-situ process such as ion implantation can be employed to introduce dopants into the bottom source and drain 204. According to an exemplary embodiment, the bottom source and drain 204 has a dopant concentration of from about $1 \times 10^{19}$ cm$^{-3}$ to about $3 \times 10^{21}$ cm$^{-3}$ and ranges therebetween.

As highlighted above, sacrificial materials are used that will later be replaced by the replacement metal gate and gate spacers. Formation of the gate regions will involve patterning these sacrificial materials along with the stack (see below). That way, when the sacrificial materials are later removed and replaced by the replacement metal gate and gate spacers, the replacement metal gate and gate spacers will be self-aligned with the bottom/top source and drains, VFET device channel, etc. As also highlighted above, the sacrificial material used as a placeholder for the gate spacers (also referred to herein as a 'first sacrificial material') needs to be selectively etchable versus the channel and gate regions, whereas the sacrificial material used as a placeholder for the replacement metal gates (also referred to herein as a 'second sacrificial material') needs to be selectively etchable versus the channel.

According to an exemplary embodiment, the first and second sacrificial materials are formed from SiGe having different concentrations of Ge. For instance, in one exemplary embodiment, the first (gate spacer) sacrificial material is formed from high Ge concentration SiGe (e.g., having a Ge content of from about 60% Ge to about 100% Ge (i.e., pure Ge) and ranges therebetween) and the second (replacement metal gate) sacrificial material is formed from low Ge concentration SiGe (e.g., having a Ge content of from about 30% Ge to about 60% Ge and ranges therebetween).

Varying the Ge concentration of the SiGe sacrificial material provides the necessary etch selectivity. For instance, by way of example only, use of ammonium hydroxide (NH$_4$OH), tetraethylammonium hydroxide (TEAH) and/or tetramethylammonium hydroxide (TMAH) as an etchant provides etch selectivity for SiGe based on Ge content, with an increase in Ge content corresponding to a decrease in the etch rate. See, for example, Loup et al., "Silicon and SiGe alloys wet etching using TMAH chemistry," Abstract #2101, 224$^{th}$ ECS Meeting, October/November 2013, 1 page (hereinafter "Loup"), the contents of which are incorporated by reference as if fully set forth herein. As provided in Loup, "[i]ncreasing the Ge content in . . . Si1-xGex alloys lead to strong decrease of the etch rate . . . whereas full Ge layers do not etch at all." Conversely, etchants such as wet hot SC1, vapor phase hydrogen chloride (HCl), vapor phase chlorine trifluoride (ClF$_3$) and/or other reactive clean processes (RCP) are selective for etching of high Ge concentration SiGe versus low concentration SiGe and Si.

As shown in FIG. 2, a layer 206 of the first sacrificial material is formed on the bottom source and drain 204. As provided above, this first sacrificial material will serve as a placeholder for the gate spacers and, according to an exemplary embodiment, is formed from a high Ge concentration SiGe (e.g., having a Ge content of from about 60% Ge to about 100% Ge (i.e., pure Ge) and ranges therebetween). According to an exemplary embodiment, the layer 206 of the first sacrificial material has a thickness of from about 5 nm to about 20 nm and ranges therebetween.

A layer 208 of the second sacrificial material is then formed on the layer 206 of the first sacrificial material. As provided above, this second sacrificial material will serve as a placeholder for the replacement metal gate and, according to an exemplary embodiment, is formed from a low Ge concentration SiGe (e.g., having a Ge content of from about 30% Ge to about 60% Ge and ranges therebetween). According to an exemplary embodiment, the layer 206 of the second sacrificial material has a thickness of from about 50 nm to about 100 nm and ranges therebetween.

Another layer 210 of the first sacrificial material is then formed on the layer 208 of the second sacrificial material. Preferably, this layer 210 has the same composition as the other layer 206 of the first sacrificial material, i.e., SiGe with a high Ge concentration (e.g., having a Ge content of from about 60% Ge to about 100% Ge (i.e., pure Ge) and ranges therebetween). According to an exemplary embodiment, the layer 210 of the first sacrificial material has a thickness of from about 5 nm to about 20 nm and ranges therebetween. As shown in FIG. 2, the resulting sacrificial layers include the layers 206/210 of the first sacrificial material with the layer 208 of the second sacrificial material therebetween.

According to an exemplary embodiment, each of the layers 206, 208 and 210 is formed from an epitaxial material. For instance, when the first/second sacrificial materials are formed from SiGe of varying (high/low) Ge concentration, each of layer 206, 208 and 210 can be deposited in-situ while regulating the Ge source to control the Ge concentration of the respective layer.

Finally, a (doped) top source and drain 212 is formed on the layer 210 of the first sacrificial material. According to one exemplary embodiment, the top source and drain 212 is formed having a thickness of from about 10 nm to about 50 nm and ranges therebetween.

In one exemplary embodiment, top source and drain 212 is formed from an in-situ doped (i.e., during growth) epitaxial material such as in-situ doped epitaxial Si, Si:C and/or SiGe. As provided above, suitable n-type dopants include, but are not limited to, P, As and/or Sb. Suitable p-type dopants include, but are not limited to, B, Ga, In, and/or Tl. Epitaxial materials may be grown from gaseous or liquid precursors. Epitaxial materials may be grown using VPE, MBE, LPE, RTCVD, MOCVD, UHVCVD, LPCVD, LRPCVD, or other suitable process. Alternatively, an ex-situ process such as ion implantation can be employed to introduce dopants into the top source and drain 212. According to an exemplary embodiment, the top source and drain 212 has a dopant concentration of from about $1 \times 10^{19}$ cm$^{-3}$ to about $3 \times 10^{21}$ cm$^{-3}$ and ranges therebetween.

The stack is then patterned into a plurality of mesas that will form the individual gate regions. To do so, a patterned hardmask 302 is formed on the stack marking the footprint and location of the gate regions. See FIG. 3. Suitable hardmask materials include, but are not limited to, nitride hardmask materials such as silicon nitride (SiN), silicon oxycarbonitride (SiOCN), etc. A variety of different techniques are contemplated herein for patterning the hardmask, such as direct patterning (using standard lithography and etching techniques) or a sidewall image transfer (SIT) process. SIT, also sometimes referred to as self-aligned double patterning (SADP), involves the use of mandrels to place sidewall spacers. The mandrels are removed selective to the sidewall spacers, which are then used to pattern the hardmask. The SIT process is a pitch doubling technique, since for each (patterned) mandrel there will be two resulting spacers/hardmasks. Thus, SIT can be used to pattern fins at a sub-lithographic pitch, i.e., a pitch smaller than what is achievable using direct lithographic patterning. A process wherein the SIT steps are repeated is referred to as self-aligned quadruple patterning (SAQP). The SAQP process is described, for example, in Fang et al., "SAQP Pitch walk metrology using single target metrology," Proc. of SPIE, vol. 10145 (March 2017) (7 total pages), the contents of which are incorporated by reference as if fully set forth herein.

Figure 3:
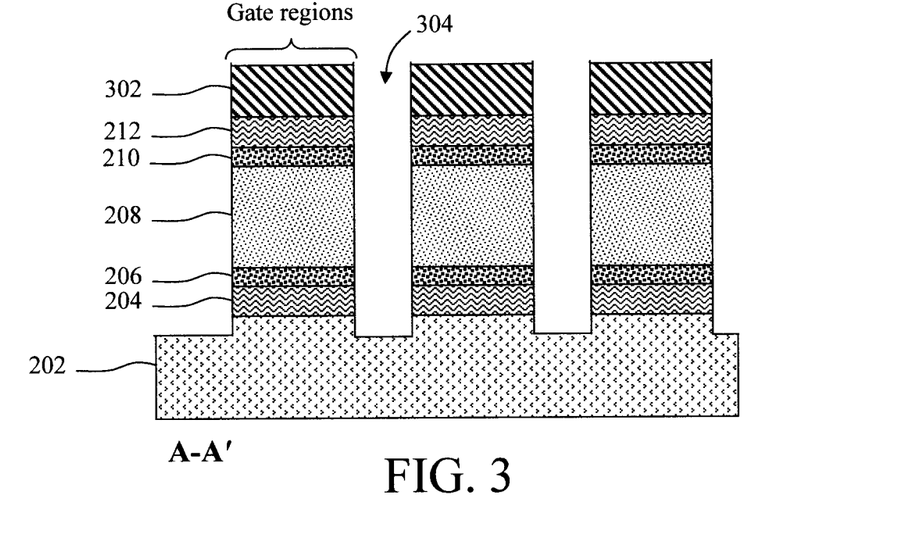
FIG. 3 is a cross-sectional diagram (A-A') illustrating a patterned hardmask having been formed on the stack and the patterned hardmask having been used to pattern trenches in the stack forming individual gate regions according to an embodiment of the present invention.

The patterned hardmask 302 is then used to pattern trenches 304 in the stack. By way of example only, a directional (anisotropic) etching process such as reactive ion etching (RIE) can be used to pattern trenches 304 in the stack. As shown in FIG. 3, as patterned, the trenches 304 extend through each of layers 204, 206, 208 and 210, and partway through the wafer 202. The mesas between the trenches 304 form a plurality of individual gate regions. FIG. 3 provides a view A-A' depicting a cross-sectional cut through/perpendicular to the VFET device channels/gate regions.

Figure 4:
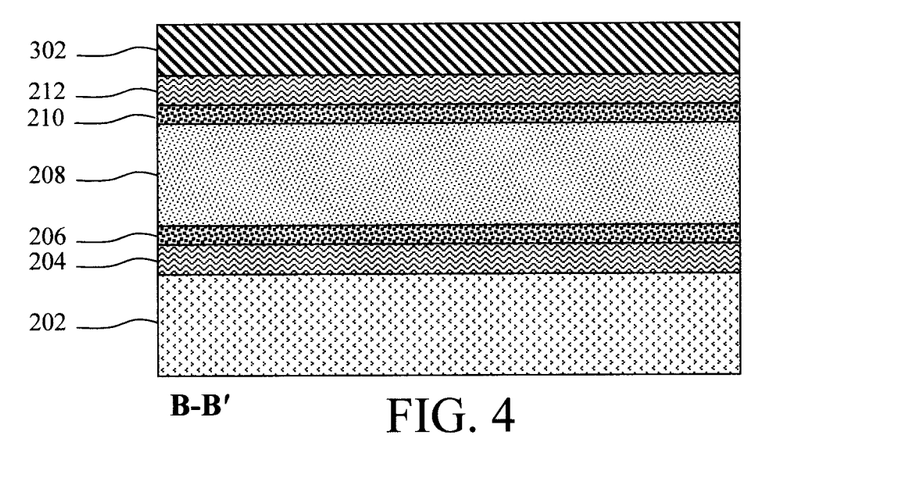
FIG. 4 is a cross-sectional diagram (B-B') illustrating the patterned hardmask having been formed on the stack according to an embodiment of the present invention.

FIG. 4 provides a view B-B' depicting a cross-sectional cut through one of the gate regions parallel to the VFET device channels/gate regions. As shown in FIG. 4, the patterned hardmask 302 has been formed on the stack. Since FIG. 4 represents a cut through one of the gate regions, the trenches 304 are not visible in this depiction.

Figure 5:
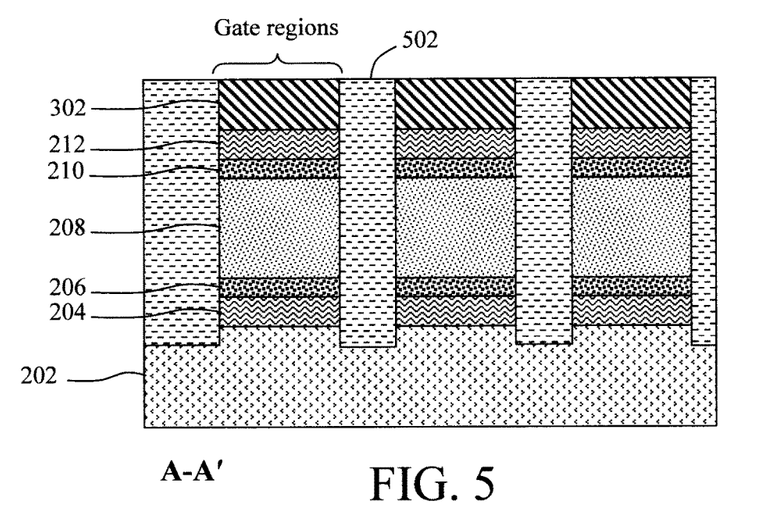
FIG. 5 is a cross-sectional diagram (A-A') illustrating the trenches having been filled with a channel material forming vertical fin VFET device channels according to an embodiment of the present invention.

The trenches 304 are then filled with a channel material 502. See FIG. 5. According to an exemplary embodiment, channel material 502 is an epitaxial semiconductor material such as epitaxial Si that is grown in the trenches 304 from a suitable precursor such as silane ($SiH_4$). As its name implies, the channel material 502 will be used to form the vertical fin VFET device channels between the gate regions. FIG. 5 provides a view A-A' depicting a cross-sectional cut through/perpendicular to the VFET device channels/gate regions. It is notable that, since the trenches 304 are not visible in a view B-B' through one of the gate regions, at this stage in the process the view B-B' would appear the same as that shown in FIG. 4 above.

Figure 6:
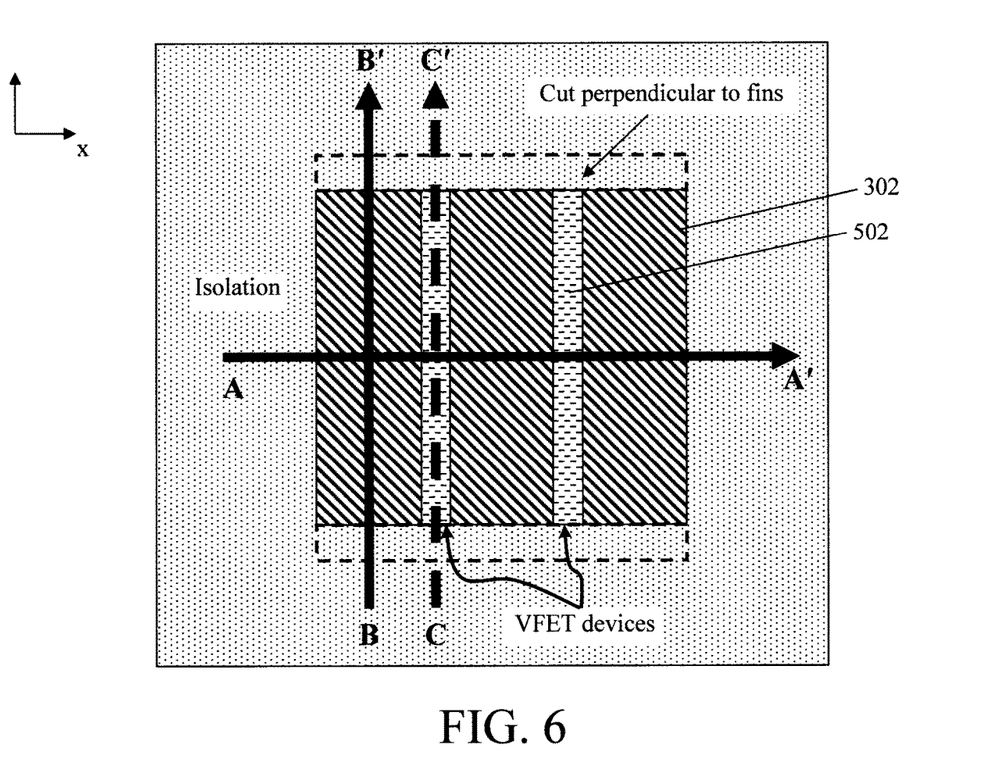
FIG. 6 is a top-down diagram illustrating an end cut of the stack having been performed along a y-direction, perpendicular to the vertical fin VFET device channels and gate regions according to an embodiment of the present invention.

An end cut of the stack is next performed. See, for example, FIG. 6. Like FIG. 1, FIG. 6 provides a top-down view of the device structure. As shown in FIG. 6, this end cut is performed along a y-direction, perpendicular to the vertical fin VFET device channels and gate regions. Notably, this end cut exposes the layers 206/210 and 208 of the first/second sacrificial materials, enabling their selective removal (see below).

By way of example only, this end cut of the stack can be performed by first forming a standard block mask (not shown) covering/masking all but the end portion of the vertical fin VFET device channels and gate regions to be cut, and then etching the vertical fin VFET device channels and gate regions around the block mask. An anisotropic etching process such as RIE can be employed for the end cut etch.

It is notable that FIG. 6 illustrates an isolation region (labeled "isolation") surrounding the device structure. In the present fabrication flow, this isolation region will in fact be formed later in the process (see, for example, FIGS. 19 and 20—described below). Thus, the depiction of an isolation region in FIG. 6 merely serves to orient the end cut of the stack with respect to the final device structure which will contain the isolation region.

Figure 7:
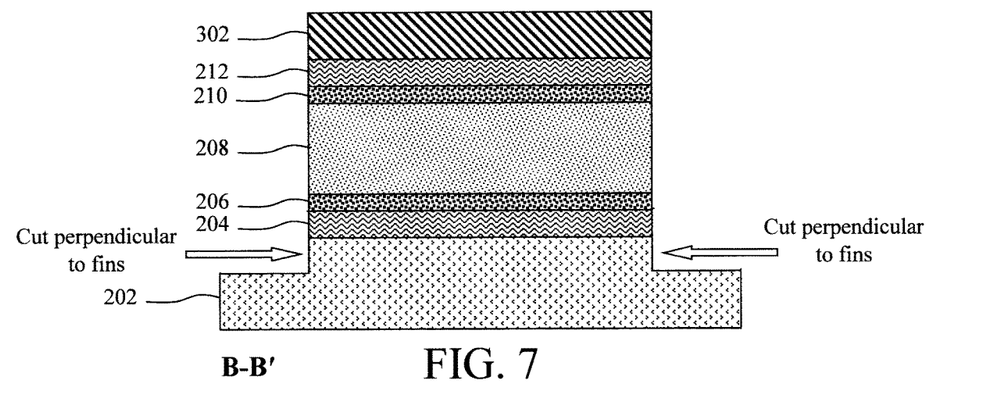
FIG. 7 is a cross-sectional diagram (B-B') illustrating the end cut of the stack having been performed along the y-direction, perpendicular to the vertical fin VFET device channels and gate regions according to an embodiment of the present invention.
Figure 8:
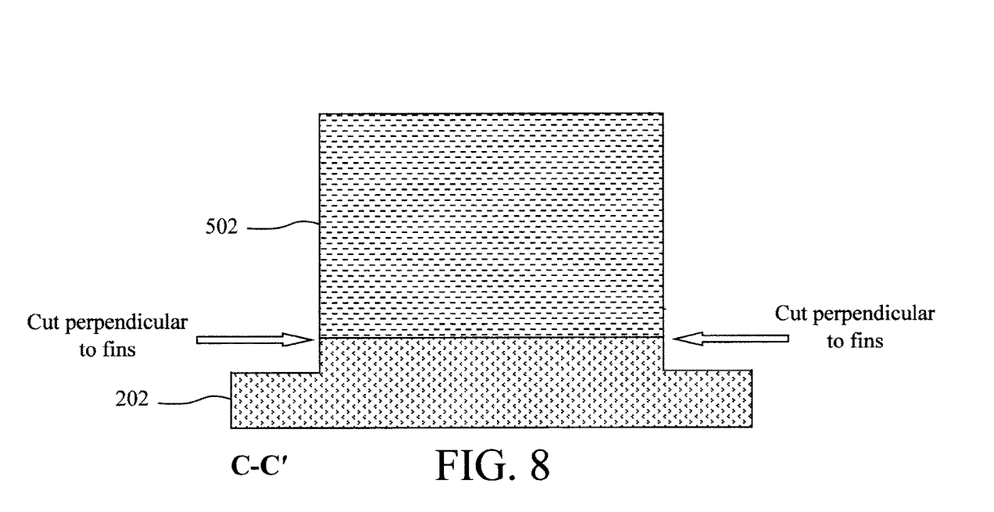
FIG. 8 is a cross-sectional diagram (C-C') illustrating the end cut of the stack having been performed along the y-direction, perpendicular to the vertical fin VFET device channels and gate regions according to an embodiment of the present invention.

Cross-sectional views of the device structure following the end cut of the vertical fin VFET device channels and gate regions are provided in FIG. 7 and FIG. 8. Namely, referring to FIG. 7, a view B-B' is provided depicting a cross-sectional cut through one of the gate regions parallel to the VFET device channels/gate regions. As shown in FIG. 7, the stack is cut perpendicular to the gate regions. Since the etch is performed from the top-down, the etch can be endpointed before the bulk of the wafer 202 is removed. As a result, only a partial etch of the wafer 102 occurs below the stack.

FIG. 8 provides a view C-C' depicting a cross-sectional cut through one of the VFET device channels parallel to the VFET device channels/gate regions. As shown in FIG. 8, the end cut is perpendicular to the vertical fin VFET device channels. It is notable, that since this end cut is along the y-direction, a view A-A' of a cross-sectional cut through/perpendicular to the VFET device channels/gate regions at this stage in the process would appear the same as that depicted in FIG. 5 (described above), since a cut has not yet been made in this x-direction.

Figure 9:
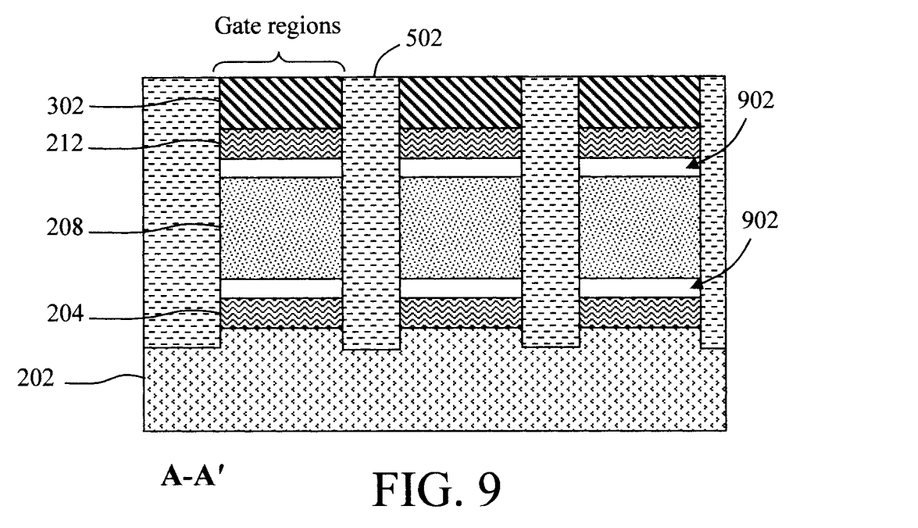
FIG. 9 is a cross-sectional diagram (A-A') illustrating the first sacrificial material (which serve as placeholders for gate spacers) having been selectively removed from the stack forming first cavities in the gate regions according to an embodiment of the present invention.

The layers 206/210 of the first sacrificial material (which serve as placeholders for the gate spacers) are then selectively removed from the stack in the gate regions. See FIGS. 9 and 10. Namely, referring to FIG. 9, a view A-A' is provided depicting a cross-sectional cut through/perpendicular to the VFET device channels/gate regions. As shown in FIG. 9, the layers 206/210 of the first sacrificial material have been removed from each of the gate regions selective to the various other layers in the stack, including layer 208 of the second sacrificial material and channel material 502. As provided above, layers 206/210 can be formed from high Ge concentration SiGe (e.g., having a Ge content of from about 60% Ge to about 100% Ge (i.e., pure Ge) and ranges therebetween, whereas the layer 208 of the second sacrificial material (which serves as a placeholder for the replacement metal gate) is formed from a low Ge concentration SiGe (e.g., having a Ge content of from about 30% Ge to about 60% Ge and ranges therebetween). As also provided above, channel material 502 is an epitaxial semiconductor material such as epitaxial Si.

Varying the Ge concentration of the SiGe sacrificial materials provides the etch selectivity needed to remove the layers 206/210 of the first sacrificial material. For instance, as provided above, etchants such as $NH_4OH$, TEAH and/or TMAH provide etch selectivity for SiGe based on Ge content, with an increase in Ge content corresponding to a decrease in the etch rate. On the other hand, etchants such as wet hot SC1, vapor phase HCl, vapor phase $ClF_3$ and other reactive clean processes are selective for etching of high Ge concentration SiGe (such as the layers 206/210 of the first sacrificial material) versus low concentration SiGe (such as the layer 208 of the second sacrificial material) and Si (such as the channel material 502). As shown in FIG. 9, removal of the layers 206/210 of the first sacrificial material results in the formation of cavities 902 in the gate regions where the gate spacers will be formed (see below). These cavities 902 will also be referred to herein as first cavities to distinguish them from the (second) cavities that will be formed by removal of the layer 208 of the second sacrificial material as described below.

Figure 10:
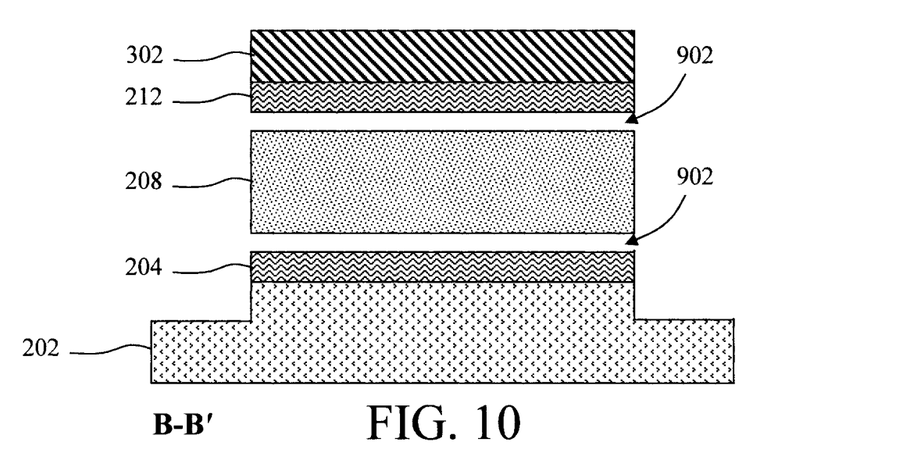
FIG. 10 is a cross-sectional diagram (B-B') illustrating the first sacrificial material having been selectively removed from the stack forming first cavities in the gate regions according to an embodiment of the present invention.

FIG. 10 provides a view B-B' depicting a cross-sectional cut through one of the gate regions parallel to the VFET device channels/gate regions. As shown in FIG. 10, the layers 206/210 of the first sacrificial material have been selectively removed from each of the gate regions. As shown in FIG. 10, removal of the layers 206/210 of the first sacrificial material results in the formation of cavities 902 in the gate regions where the gate spacers will be formed (see below). It is notable, that since the layers 206/210 and 208 of the first and second sacrificial materials are present only in the gate regions, at this stage in the process a view C-C' of a cross-sectional cut through one of the VFET device channels parallel to the VFET device channels/gate regions would appear the same as that depicted in FIG. 8 (described above).

Figure 11:
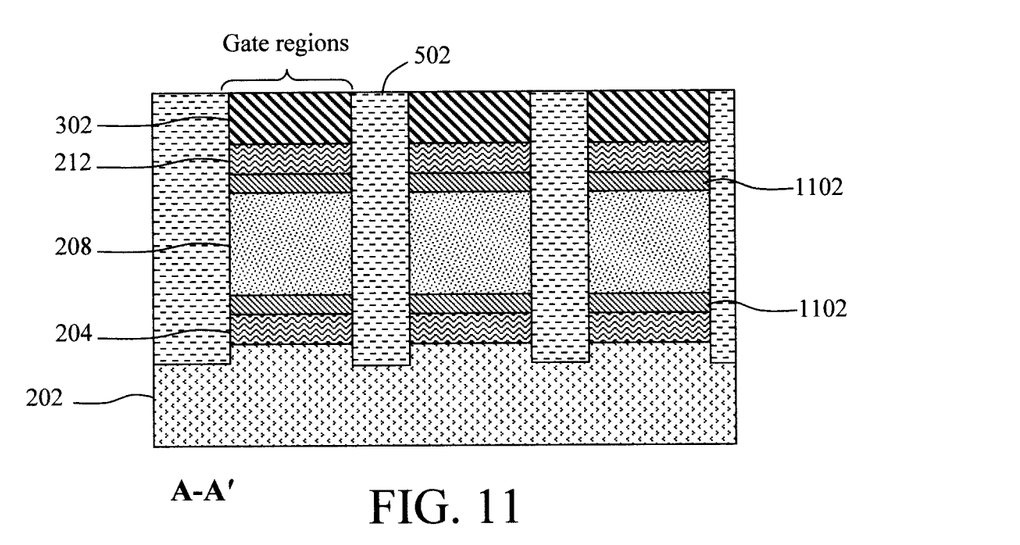
FIG. 11 is a cross-sectional diagram (A-A') illustrating gate spacers having been formed in the first cavities according to an embodiment of the present invention.

Gate spacers 1102 are then formed in the cavities 902. See FIG. 11 and FIG. 12. Namely, referring to FIG. 11, a view A-A' is provided depicting a cross-sectional cut through/perpendicular to the VFET device channels/gate regions. As shown in FIG. 11, gate spacers 1102 have been formed in the cavities 902 to either side of the layer 208 of the second sacrificial material in each of the gate regions. When the layer 208 of the second sacrificial material is later removed and replaced with replacement metal gates (see below), the gate spacers 1102 will serve to offset the replacement metal gates from the bottom source and drain 204, and from the top source and drain 212.

By way of example only, gate spacers 1102 are formed by filling the cavities 902 with a spacer material, followed by an etch back to remove any excess spacer material deposited outside of cavities 902. Suitable gate spacer materials include, but are not limited to, low-$\kappa$ spacer materials such as silicon oxide (SiOx) and/or nitride spacer materials such as SiN and/or SiOCN. By way of example only, a deposition process such as plasma-assisted chemical vapor deposition (CVD) or atomic layer deposition (ALD) can be used to fill the spacer material into the cavities 902. A wet and/or dry etching process such as hydrofluoric acid (HF) diluted with ethylene glycol (HFEG) and/or RIE can be used for the etch back.

Figure 12:
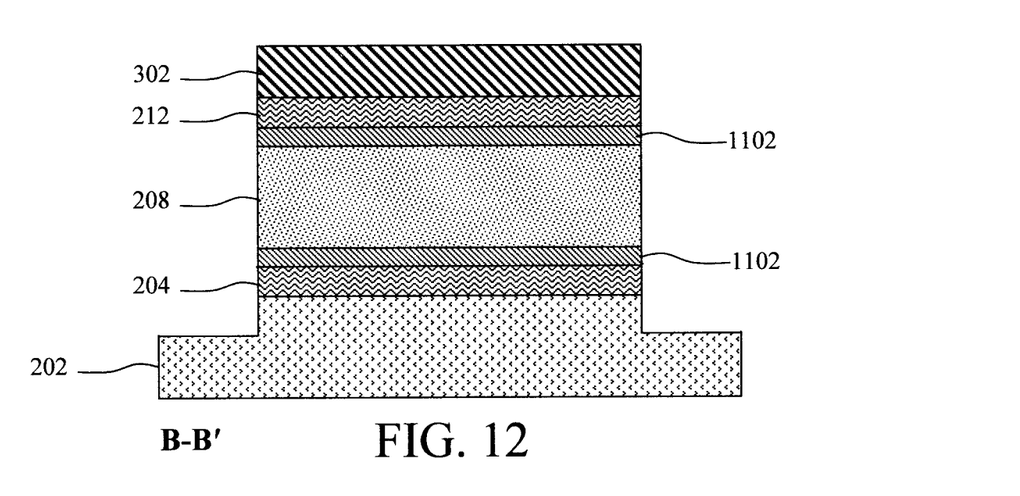
FIG. 12 is a cross-sectional diagram (B-B') illustrating gate spacers having been formed in the first cavities according to an embodiment of the present invention.

FIG. 12 provides a view B-B' depicting a cross-sectional cut through one of the gate regions parallel to the VFET device channels/gate regions. As shown in FIG. 12, gate spacers 1102 have been formed in the cavities 902 to either side of the layer 208 of the second sacrificial material. It is notable, that since cavities 902 are present only in the gate regions, a view C-C' of a cross-sectional cut through one of the VFET device channels parallel to the VFET device channels/gate regions at this stage in the process would appear the same as that depicted in FIG. 8 (described above).

Figure 13:
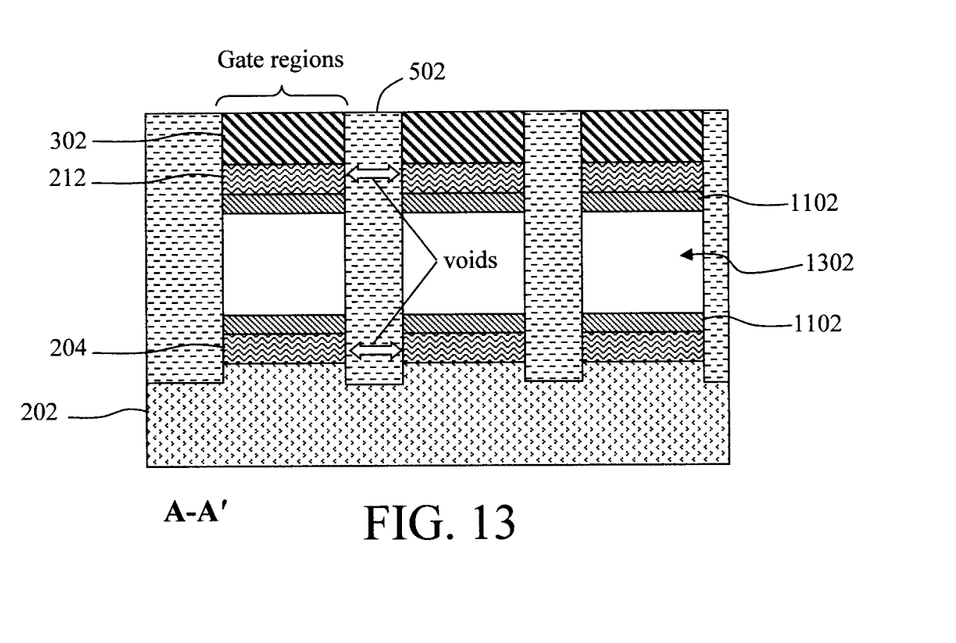
FIG. 13 is a cross-sectional diagram (A-A') illustrating the layer of the second sacrificial material (which serves as a placeholder for the replacement metal gate) having been selectively removed from the stack forming second cavities in the gate regions according to an embodiment of the present invention.

The layer 208 of the second sacrificial material (which serves as a placeholder for the replacement metal gate) is then selectively removed from the stack in the gate regions. See FIGS. 13 and 14. Namely, referring to FIG. 13, a view A-A' is provided depicting a cross-sectional cut through/perpendicular to the VFET device channels/gate regions. As shown in FIG. 13, the layer 208 of the second sacrificial material has been removed from each of the gate regions selective to the various other layers in the stack, including channel material 502 (e.g., epitaxial Si). Removal of the layer 208 of the second sacrificial material results in the formation of (second) cavities 1302 in each of the gate regions where the replacement metal gates will be formed (see below). As provided above, the layer 208 of the second sacrificial material (which serves as a placeholder for the replacement metal gate) can be formed from a low Ge concentration SiGe (e.g., having a Ge content of from about 30% Ge to about 60% Ge and ranges therebetween). Etchants such as $NH_4OH$, TEAH and/or TMAH provide etch selectivity for SiGe based on Ge content, with a decrease in Ge content corresponding to an increase in the etch rate.

Figure 14:
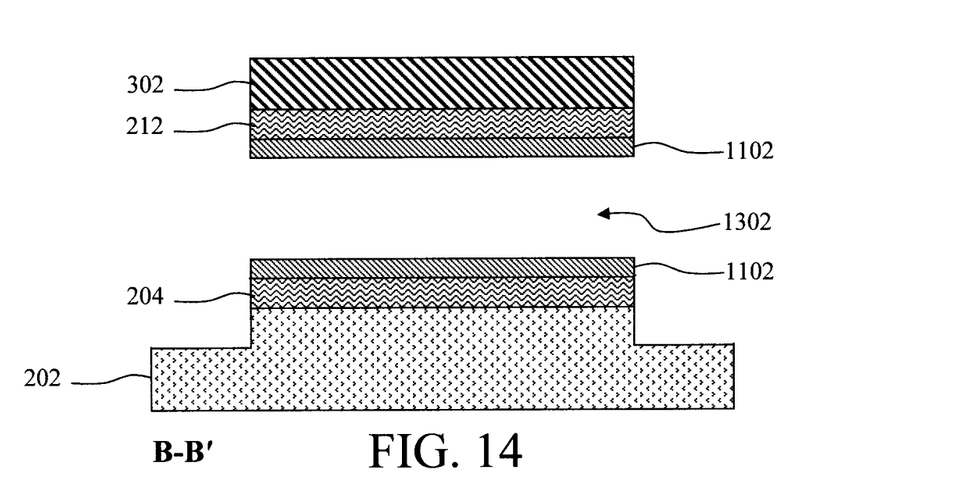
FIG. 14 is a cross-sectional diagram (B-B') illustrating the layer of the second sacrificial material (which serves as a placeholder for the replacement metal gate) having been selectively removed from the stack forming second cavities in the gate regions according to an embodiment of the present invention.

FIG. 14 provides a view B-B' depicting a cross-sectional cut through one of the gate regions parallel to the VFET device channels/gate regions. As shown in FIG. 14, the layer 208 of the second sacrificial material has been selectively removed from each of the gate regions. As shown in FIG. 14, gate spacers 1102 are present on the top and bottom of each of the cavities 1302 formed by the removal of the layer 208 of the second sacrificial material. It is notable, that since the sacrificial materials are present only in the gate regions, at this stage in the process a view C-C' of a cross-sectional cut through one of the VFET device channels parallel to the VFET device channels/gate regions would appear the same as that depicted in FIG. 8 (described above).

Referring briefly back to FIG. 13, it can be seen that voids are present at the bottom/top source and drains 204/212 between adjacent gate regions. It is desirable to have overlap between the devices. Thus, an anneal of the stack is next performed to diffuse dopants from the bottom/top source and drains 204/212 into the channel material 502 present between adjacent gate regions, forming bottom/top source and drain extensions 1502/1504, respectively. See FIG. 15 and FIG. 16. According to an exemplary embodiment, this dopant diffusion anneal is performed at a temperature of from about 600° C. to about 1300° C. and ranges therebetween.

Figure 15:
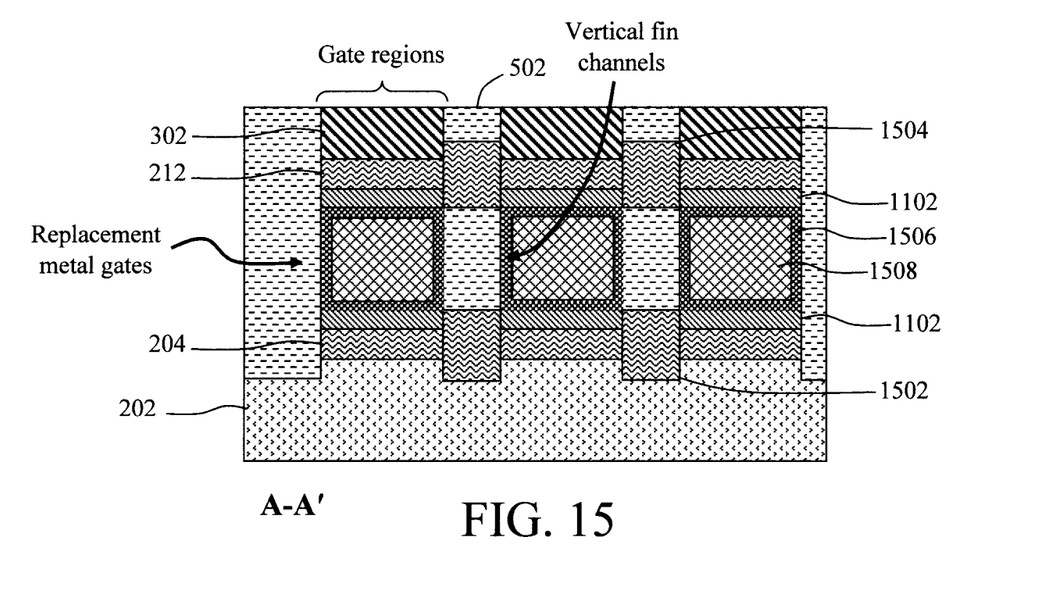
FIG. 15 is a cross-sectional diagram (A-A') illustrating an anneal of the stack having been performed to diffuse dopants from the bottom/top source and drains into the channel material forming bottom/top source and drain extensions, and replacement metal gates having been formed in the second cavities according to an embodiment of the present invention.

Replacement metal gates are then formed in the cavities 1302. According to an exemplary embodiment, the replacement metal gates are formed by first depositing a conformal high-$\kappa$ gate dielectric 1506 into and lining the cavities 1302. The term "high-$\kappa$" as used herein refers to a material having a relative dielectric constant $\kappa$ which is much higher than that of silicon dioxide (e.g., a dielectric constant $\kappa$ is about 25 for hafnium oxide ($HfO_2$) rather than 3.9 for $SiO_2$). A (i.e., metal) gate conductor 1508 is then deposited onto the high-$\kappa$ gate dielectric 1506, filling the cavities 1302. By way of example only, a deposition process such as plasma-assisted CVD or ALD can be used to deposit the high-$\kappa$ gate dielectric 1506 and gate conductor 1508 into the cavities 1302.

Namely, referring to FIG. 15, a view A-A' is provided depicting a cross-sectional cut through/perpendicular to the VFET device channels/gate regions. As shown in FIG. 15, bottom/top source and drain extensions 1502/1504 have been formed between adjacent gate regions, and replacement metal gates (i.e., high-$\kappa$ gate dielectric 1506/gate conductor 1508) have been formed in the cavities. The high-$\kappa$ gate dielectric 1506 lines the surfaces of the channel material 502 and gate spacers 1102 that define the cavities 1302. The gate conductor 1508 fills the cavities 1302 over the high-$\kappa$ gate dielectric 1506. As shown in FIG. 15, each gate region includes: i) a (doped) bottom source and drain 204 disposed on the wafer 202, ii) a replacement metal gate above the bottom source and drain 204, iii) a (doped) top source and drain 212 above the replacement metal gate, and iv) gate spacers 1102 offsetting the replacement metal gate from the bottom source and drain 204, and from the top source and drain 212.

Figure 16:
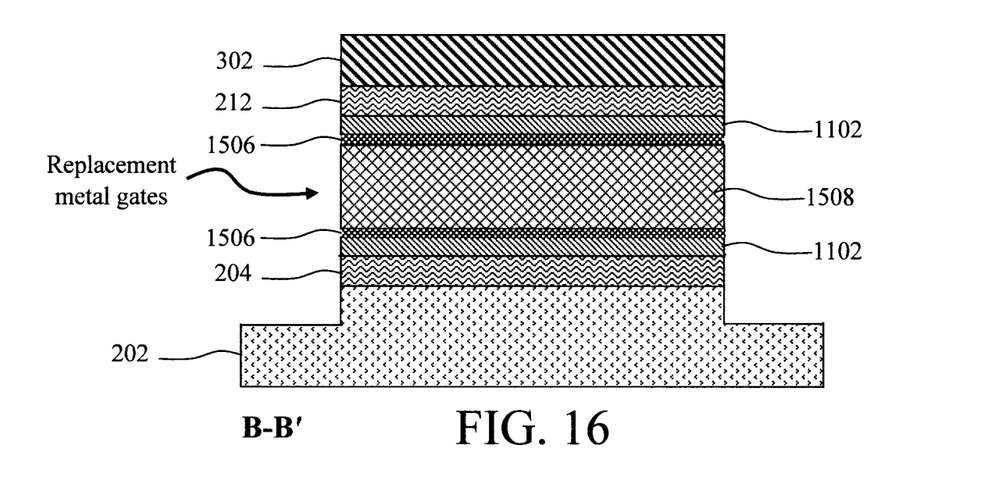
FIG. 16 is a cross-sectional diagram (B-B') illustrating an anneal of the stack having been performed to diffuse dopants from the bottom/top source and drains into the channel material forming bottom/top source and drain extensions, and replacement metal gates having been formed in the second cavities according to an embodiment of the present invention.

FIG. 16 provides a view B-B' depicting a cross-sectional cut through one of the gate regions parallel to the VFET device channels/gate regions. Since the bottom/top source and drain extensions 1502/1504 have been formed outside of the gate regions, the bottom/top source and drain extensions 1502/1504 are not visible in FIG. 16. As shown in FIG. 16, the high-κ gate dielectric 1506 separates the gate conductor 1508 from the gate spacers 1102.

Suitable high-κ gate dielectrics 1506 include, but are not limited to, metal oxides such as hafnium oxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), and/or lead zinc niobite (Pb(Zn,Nb)O). The high-κ gate dielectric 1506 can further include dopants such as lanthanum (La), aluminum (Al) and/or magnesium (Mg). According to an exemplary embodiment, the high-κ gate dielectric 1506 has a thickness of from about 1 nm to about 5 nm and ranges therebetween.

Suitable gate conductors 1508 include, but are not limited to, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag) and/or gold (Au)), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), and/or transition metal aluminides (e.g., $Ti_3Al$ and/or ZrAl). The gate conductor 1508 can further include dopants that are incorporated during or after deposition.

In some embodiments, the replacement metal gates can further include a workfunction setting layer (not shown) between the high-κ gate dielectric 1506 and the gate conductor 1508. The workfunction setting layer can be a workfunction metal including, but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC), titanium aluminum carbide (TiAlC), tantalum carbide (TaC), and/or hafnium carbide (HfC). In some embodiments, a conductive material or a combination of multiple conductive materials can serve as both gate conductor and workfunction metal.

The VFET device now includes gate regions having a replacement metal gate offset from the bottom/top source and drains 204/212 by the gate spacers 1102, vertical fin channels (formed from channel material 502) in between the gate regions, and bottom/top source and drain extensions 1502/1504 between the adjacent gate regions. Isolation of this active device area on the wafer 202 is then performed using, e.g., a shallow trench isolation (STI) process. Generally, STI involves patterning trenches and then filling the trenches with an insulator (such as an STI oxide) to form STI regions in a wafer.

Figure 17:
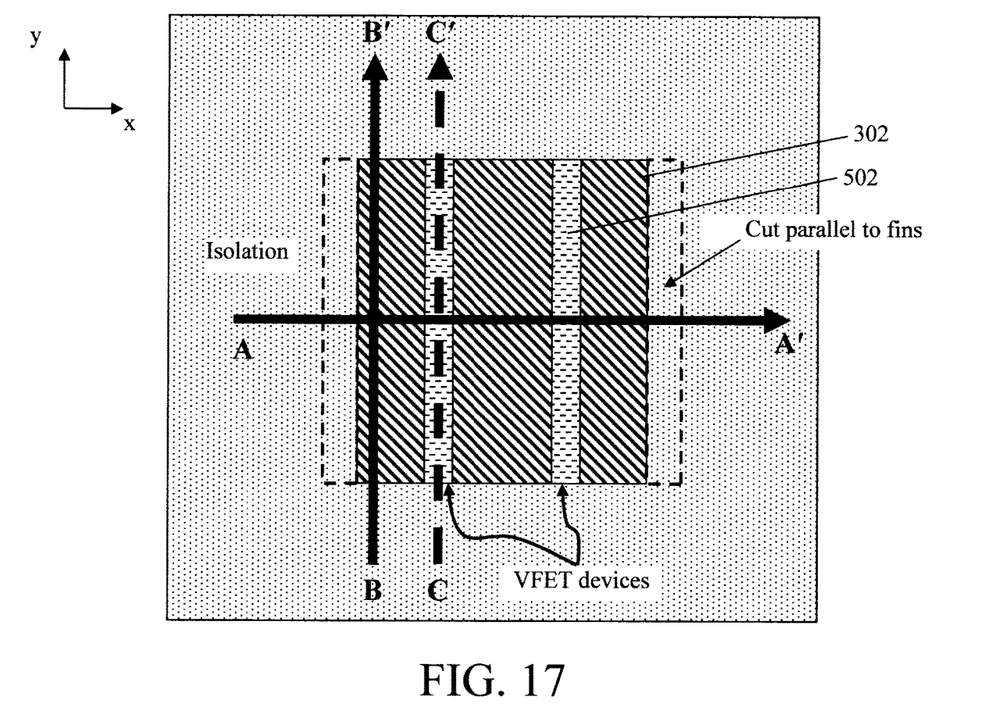
FIG. 17 is a top-down diagram illustrating an end cut of the stack having been performed along an x-direction, parallel to the vertical fin VFET device channels and gate regions according to an embodiment of the present invention.

To do so, an end cut of the stack parallel to the vertical fin VFET device channels and gate regions is next performed. See, for example, FIG. 17. Like FIG. 1 and FIG. 6, FIG. 17 provides a top-down view of the device structure. As shown in FIG. 17, this end cut is performed along the x-direction. This end cut enables an isolation region to be formed (see below) fully surrounding the VFET device.

As above, this end cut can be performed by first forming a standard block mask (not shown) covering/masking all but the end portions of the vertical fin VFET device channels and gate regions to be cut, and then etching the vertical fin VFET device channels and gate regions around the block mask. An anisotropic etching process such as RIE can be employed for the end cut etch.

It is notable that FIG. 17 illustrates an isolation region (labeled "isolation") surrounding the device structure. In the present fabrication flow, this isolation region will in fact be formed later in the process (see, for example, FIGS. 19 and 20—described below). Thus, the depiction of an isolation region in FIG. 17 merely serves to orient the end cut of the stack with respect to the final device structure which will contain the isolation region.

Figure 18:
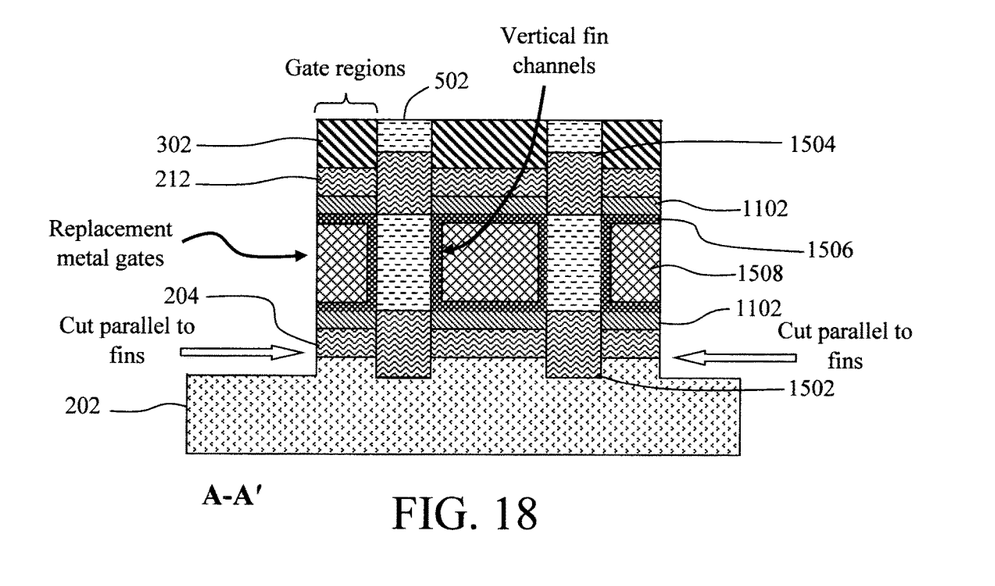
FIG. 18 is a cross-sectional diagram (A-A') illustrating the end cut of the stack having been performed along the x-direction, parallel to the vertical fin VFET device channels and gate regions according to an embodiment of the present invention.

A cross-sectional view of the device structure following this parallel end cut is provided in FIG. 18. Namely, referring to FIG. 18, a view A-A' is provided depicting a cross-sectional cut through/perpendicular to the VFET device channels/gate regions. As shown in FIG. 18, the stack is end cut parallel to the VFET device channels/gate regions. Since the etch is performed from the top-down, the etch can be endpointed before the bulk of the wafer 202 is removed. As a result, only a partial etch of the wafer 202 occurs below the stack. Since the cross-sections B-B' and C-C' are along the y-direction through one of the gate regions and VFET device channels, respectively, these views would not show this end cut in the x-direction.

A liner 1902 is first deposited on the exposed ends of the cut stack and on the exposed surfaces of wafer 202. See FIG. 19 and FIG. 20. Suitable materials for liner 1902 include, but are not limited to, SiN and/or silicon oxynitride (SiON). According to an exemplary embodiment, liner 1902 has a thickness of from about 2 nm to about 5 nm and ranges therebetween. An insulator 1904 is then deposited over the liner 1902. Suitable insulators 1904 include, but are not limited to, oxide insulator such as silicon oxide (SiOx), i.e., an STI oxide. Contacts 1906/1908 are then formed to the bottom/top source and drains 204/212 (see FIG. 19), and contact 1910 is formed to the replacement metal gate (see FIG. 20). Standard middle of the line (MOL) metallization processes can be used to form the contacts 1906, 1908, and 1910. As provided above, the wafer 202 can be doped. Accordingly, access to the bottom source and drains 204 by contact 1906 can occur via the (doped) wafer 202.

Figure 19:
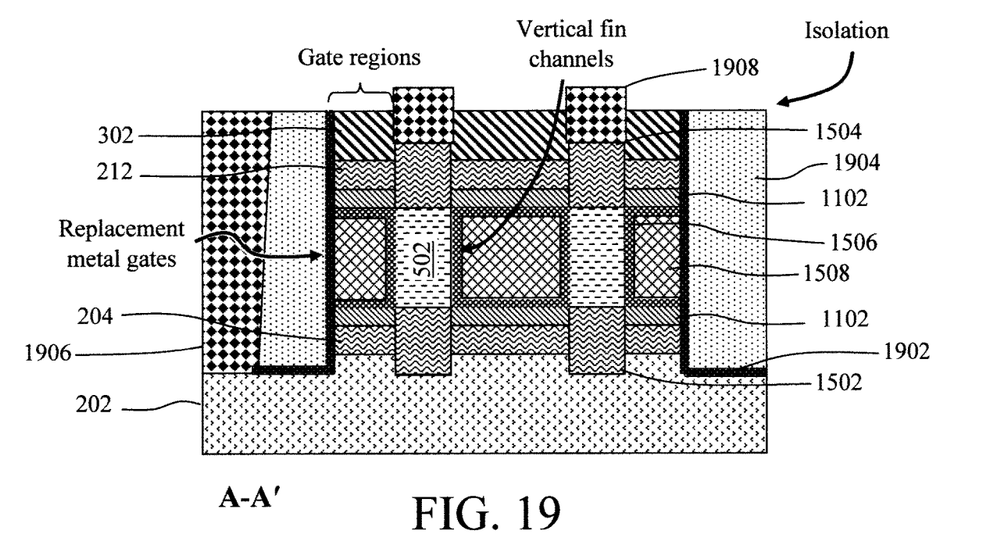
FIG. 19 is a cross-sectional diagram (A-A') illustrating a liner having been deposited on the exposed ends of the cut stack and on the exposed surfaces of wafer, an insulator having been deposited over the liner, and contacts having been formed to the bottom/top source and drains according to an embodiment of the present invention.
Figure 20:
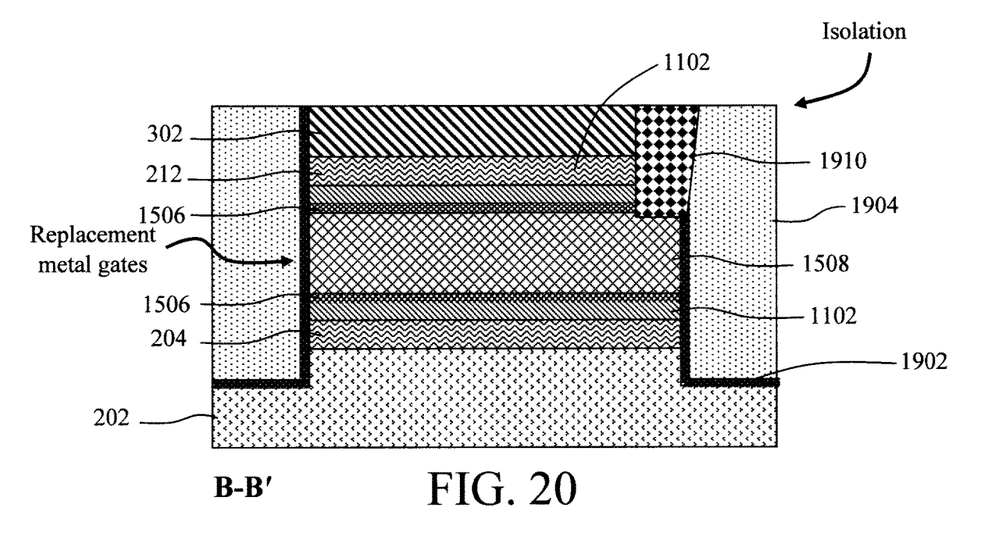
FIG. 20 is a cross-sectional diagram (A-A') illustrating a liner having been deposited on the exposed ends of the cut stack and on the exposed surfaces of wafer, an insulator having been deposited over the liner, and a contact having been formed to the replacement metal gate according to an embodiment of the present invention.

Namely, referring to FIG. 19, a view A-A' is provided depicting a cross-sectional cut through/perpendicular to the VFET device channels/gate regions. As shown in FIG. 19, an isolation region has been formed surrounding the VFET device, and contacts 1906/1908 have been formed to the bottom/top source and drains 204/212. FIG. 20 provides a view B-B' depicting a cross-sectional cut through one of the gate regions parallel to the VFET device channels/gate regions. As shown in FIG. 20, isolation region surrounds the VFET device, and contact 1910 has been formed to the replacement metal gate.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical field effect transistor (VFET) device, comprising:
    a wafer;
    gate regions on the wafer, the gate regions each comprising: i) a doped bottom source/drain disposed on the wafer, ii) a gate above the doped bottom source/drain, iii) a doped top source/drain above the gate, and iv) gate spacers offsetting the gate from the doped bottom source/drain, and from the doped top source/drain;
    vertical fin channels between the gate regions; and
    bottom source/drain extensions and top source/drain extensions between adjacent gate regions, wherein the doped bottom source/drain is present on opposite sides of each of the bottom source/drain extensions, and wherein the doped top source/drain is present on opposite sides of each of the top source/drain extensions.

2. The VFET device of claim 1, wherein the vertical fin channels comprise epitaxial silicon (Si).

3. The VFET device of claim 1, wherein the gate spacers comprise a material selected from the group consisting of: silicon oxide (SiOx), silicon nitride (SiN), silicon oxycarbonitride (SiOCN), and combinations thereof.

4. The VFET device of claim 1, wherein the gate comprises:
    a high-κ gate dielectric; and
    a metal gate conductor disposed on the high-κ gate dielectric.

5. The VFET device of claim 4, wherein the high-κ gate dielectric comprises a material selected from the group consisting of: hafnium oxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), lead zinc niobite (Pb(Zn,Nb)O), and combinations thereof.

6. The VFET device of claim 4, wherein the metal gate conductor comprises a material selected from the group consisting of: tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi), transition metal aluminides, and combinations thereof.

7. The VFET device of claim 4, wherein the high-κ gate dielectric fully surrounds the metal gate conductor in at least one of the gate regions.

8. The VFET device of claim 1, further comprising:
    a contact to the doped bottom source/drain.

9. The VFET device of claim 1, further comprising:
    contacts to the doped top source/drain.

10. The VFET device of claim 9, wherein the top source/drain extensions are present between the contacts and the doped top source/drain.

11. The VFET device of claim 1, further comprising:
    an isolation region surrounding the VFET device.

12. The VFET device of claim 11, wherein the isolation region comprises:
    a liner disposed alongside the gate regions and on the wafer; and
    an insulator disposed on the liner.

13. The VFET device of claim 12, wherein the liner has a thickness of from about 2 nanometers (nm) to about 5 nm and ranges therebetween.

14. The VFET device of claim 12, wherein the liner comprise a material selected from the group consisting of: SiN, silicon oxynitride (SiON), and combinations thereof.

15. The VFET device of claim 12, wherein the insulator comprises an oxide insulator.

16. The VFET device of claim 1, wherein the vertical fin channels are present between the bottom source/drain extensions and the top source/drain extensions.

17. The VFET device of claim 1, further comprising:
    a hardmask in the gate regions disposed on the doped top source/drain.

18. The VFET device of claim 1, wherein the bottom source/drain extensions are adjacent to both the gate spacers and the doped bottom source/drain.

19. The VFET device of claim 1, wherein the top source/drain extensions are adjacent to both the gate spacers and the doped top source/drain.

* * * * *